(12) United States Patent
Boemler

(10) Patent No.: US 10,687,004 B1
(45) Date of Patent: Jun. 16, 2020

(54) LOW NOISE PASSIVE PIXEL READOUT CIRCUIT

(71) Applicant: Raytheon Company, Waltham, MA (US)

(72) Inventor: Christian M. Boemler, Goleta, CA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 16/292,806

(22) Filed: Mar. 5, 2019

(51) Int. Cl.
| | |
|---|---|
| *H01L 27/146* | (2006.01) |
| *H04N 5/357* | (2011.01) |
| *H04N 5/378* | (2011.01) |
| *H04N 5/3745* | (2011.01) |

(52) U.S. Cl.
CPC ....... *H04N 5/357* (2013.01); *H01L 27/14609* (2013.01); *H01L 27/14643* (2013.01); *H04N 5/378* (2013.01); *H04N 5/3745* (2013.01)

(58) Field of Classification Search
None
See application file for complete search history.

(56) References Cited

U.S. PATENT DOCUMENTS

| | | | |
|---|---|---|---|
| 6,750,912 B1 | 6/2004 | Tennant et al. | |
| 7,782,383 B2 * | 8/2010 | Olsen | H04N 5/357 250/208.1 |
| 8,934,087 B1 | 1/2015 | Stobie et al. | |
| 2015/0124130 A1 | 5/2015 | Yin | |
| 2016/0156870 A1 * | 6/2016 | Kikuchi | H04N 5/357 348/300 |

* cited by examiner

*Primary Examiner* — Mark T Monk
(74) *Attorney, Agent, or Firm* — Cantor Colburn LLP

(57) ABSTRACT

A passive readout circuit for reading out a charge stored on an integration capacitor coupled to a photodiode includes a column bus selectively connectable to the integration capacitor, at least one shield line arranged near the column bus such that a first parasitic capacitance is created between the at least one shield line and the column bus and an amplifier having a first input, a second input and an output. The column is connected to the first input and the at least one shield line is connected to the output of the amplifier.

19 Claims, 4 Drawing Sheets

LOW NOISE PASSIVE PIXEL READOUT CIRCUIT

BACKGROUND

The present disclosure relates to a pixel imager and, in particular, a passive pixel read out circuit having low noise.

In legacy analog imagers, particularly infrared imagers, photo-current from a photo-detector, such as a photodiode, is stored on an integration capacitor. A well or integration capacitor is connected between the photodiode and a reference voltage, and then once per video frame, the voltage or charge of the well capacitor is transferred to a down-stream analog-to-digital converter (ADC), where the voltage is converted to a binary value.

There are different ways to control the flow of photo-current to the integration capacitor. For example, a direct injection (DI) transistor can control the flow of current from the photodiode transistor into the integration capacitor. The gate of the DI transistor is connected to a bias voltage. The level of this voltage can be selected by the skilled artisan and is used, in part, to keep the photodiode in reverse bias.

Current pixels read out analog voltages stored on the integration capacitor into column wires. There are two types of readout; active and passive.

An active readout will typically include a source follower (SF) transistor (SF buffer) inside the pixel to buffer voltages to a column line. In operation, the voltage buffered into the column line is directly sampled on a column capacitor at the column circuit. The length of the SF transistor drives the noise floor (1/f noise) and the width drives the settling time from selection onto the column line and the column capacitor.

As pixels shrink, noise floors decrease and readout rates increase, the area needed for the SF becomes relatively larger—reducing the area available for providing the integration capacitor. This reduced area, thus, reduces the full well of the pixel and can increase the signal to noise ratio of the pixel.

In contrast, a passive read out circuit such as a capacitance transimpedance amplifier (CTIA) requires only a minimum sized switch to directly connect the integration capacitor to the column wire. That is, the SF buffer is omitted and a larger full well can be created. Charge dumped into the column wire is amplified through a column level CTIA that includes an active amplifier to convert this charge to a voltage before it can be sampled onto a capacitor. Passive pixel readout traditionally suffers one major issue; parasitic capacitances on the column wire increases the noise gain of the amplifier in the CTIA. The increased noise eventually led to the abandonment of passive readout circuits in favor of active readout circuits.

SUMMARY

According to one embodiment, a passive readout circuit for reading out a charge stored on an integration capacitor coupled to a photodiode is disclosed. The passive readout circuit includes a column bus selectively connectable to the integration capacitor, at least one shield line arranged near the column bus such that a first parasitic capacitance is created between the at least one shield line and the column bus and an amplifier having a first input, a second input and an output. The column bus in this embodiment is connected to the first input and the at least one shield line is connected to the output of the amplifier.

In any passive circuit disclosed herein, the at least one shield line can include a first shield line and a second shield line and both the first and second shield lines are connected to the output of the amplifier.

In any passive circuit disclosed herein, the column bus and the first shield line can be arranged on a substrate formed of an oxide and define a first metal-oxide-metal capacitor.

In any passive circuit disclosed herein, the column bus and the second shield line can be arranged on the substrate and define a second metal-oxide-metal capacitor.

In any passive circuit disclosed herein, the first and second metal-oxide-metal capacitors can define a feedback capacitance coupled between the first input and the output.

In any passive circuit disclosed herein, the second input can be a non-inverting input and be connected to a reference voltage and the first input can be an inverting input.

In any passive circuit disclosed herein, the circuit can further include a reset switch connected between the first input and the output.

In any passive circuit disclosed herein, the circuit can be combined with a row select switch connected between the integration capacitor and the column bus that selectively connects the column bus to the integration capacitor.

In one embodiment, an image detector is disclosed and includes a photo-diode, an integration connected to the photo-diode and a passive readout circuit comprising: a column bus selectively connectable to the integration capacitor; a first shield line arranged near the column bus such that a first parasitic capacitance is created between the first shield line and the column bus; a second shield line arranged near the column bus such that a second parasitic capacitance is created between the first shield line and the column bus; and an amplifier having a first input, a second input and an output. In this embodiment, the column bus is connected to the first input, and the first and second shield lines are both connected to the output of the amplifier.

In any image detector disclosed herein, the detector can further include a bias control circuit connected between the photo-diode and the integration capacitor.

In any image detector disclosed herein, the second input can be a non-inverting input and be connected to a reference voltage and the first input can be an inverting input.

In any image detector disclosed herein, the detector can further include a reset switch connected between the first input and the output.

In any image detector disclosed herein, the detector can further include a row select switch connected between the integration capacitor and the column bus that selectively connects the column bus to the integration capacitor.

Also disclosed is a method of forming a passive readout circuit for reading out a charge stored on an integration capacitor coupled to a photo-diode. The method includes: forming a column bus on a substrate; forming a first shield line on the substrate near the column bus such that a first parasitic capacitance is created between the first shield line and the column bus when charge from the integration capacitor is discharged onto the column bus; forming a second shield line on the substrate near the column bus such that a second parasitic capacitance is created between the second shield line and the column bus when charge from the integration capacitor is discharged onto the column bus; connecting the column bus to a first input of an amplifier, the amplifier including the first input, a second input and an output; and connecting the first and second shield lines to the output of the amplifier.

In any method disclosed herein, the substrate can be formed of an oxide and the column bus and the first shield line can define a first metal-oxide-metal capacitor.

In any method disclosed herein, the column bus and the second shield line can define a second metal-oxide-metal capacitor.

In any method disclosed herein, the second input can be a non-inverting input, the first input can be an inverting input and the method can further include connecting a reference voltage to the second input.

In any method disclosed herein, the method can further include connecting a reset switch between the first input and the output.

In any method disclosed herein, the method can further include connecting a row select switch between the integration capacitor and the column bus that selectively connects the column bus to the integration capacitor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
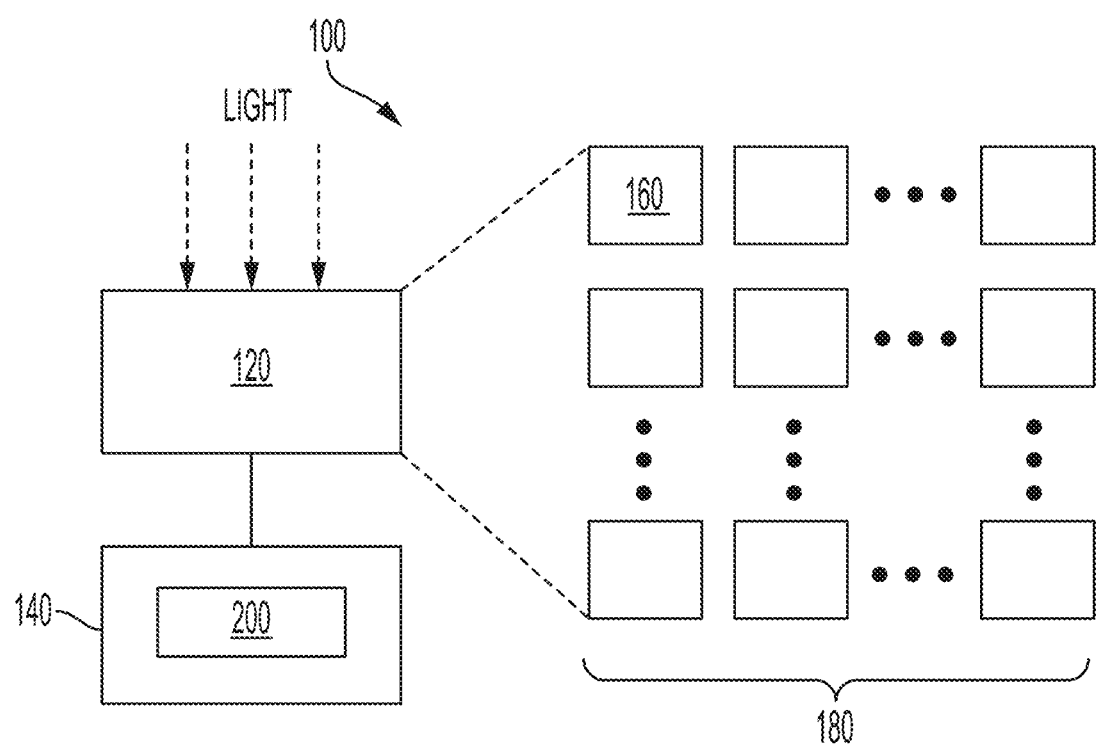
FIG. 1 is a schematic diagram illustrating image detector in accordance with embodiments.

FIG. 1 is a schematic diagram illustrating an image detector 100 in accordance with embodiments. Such a detector 100 may be deployed, for example, on a satellite or other airborne apparatus such as an aircraft or any land- or sea-based tactical application in which it is a requirement that frame rate not be limited by array size. Image detector 100 may be a focal plane array (FPA), active pixel sensor (APS) or any other suitable energy wavelength sensing device. The image detector 100 may be used as a component of a photographic and/or image capturing device, such as a digital camera, video camera or other similar device. The image detector 100 may include a detection device 120 and an analog-to-digital converter (ADC) 140.

The detection device 120 includes an array of photosensitive/energy wavelength sensitive detector unit cells 160 arranged in an X×Y matrix or array 180. As is known in the art, the defector cells 160 in the array 180 can be arranged in row/column format and each unit cell can be connected to a column line.

Each of the detector unit cells 160 may accumulate charge or produce a current and/or voltage in response to light incident upon the detector unit cell 160 and may correspond to a pixel in a captured electronic image. One or more of the detector unit cells 160 may include a photovoltaic detector (e.g., a photovoltaic single absorber detector or a photovoltaic multi-absorber (multi-junction) detector), a barrier device detector, a position sensitive detector (PSD) or other suitable detector.

The ADC 140 may be used for processing of the incident light (e.g., to create an image representative of the incident light). For example, the ADC 140 interfaces with the detection device 120 to receive a signal, such as the accumulated charge or the current and/or voltage produced in response to light incident upon the detector unit cells 160. In one embodiment, the ADC 140 includes a passive readout circuit 200 that accumulates voltage/current from which the digital output is produced. In one embodiment, a passive readout circuit is connected to each column line of the array 180.

As more fully described below, the passive readout circuit 200 disclosed herein is similar to a prior art capacitance transimpedance amplifier (CTIA) readout circuit but rather than having a discrete feedback capacitor connected between the input and the output of the differential amplifier in the CTIA, a parasitic capacitance formed by traces around column line connecting the integration capacitor to the amplifier provides the capacitance.

In such systems and as generally described above, it is known to utilize an injection transistor to place a diode in the detector unit cell into reverse bias so that it will generate current when exposed to light.

Figure 2:
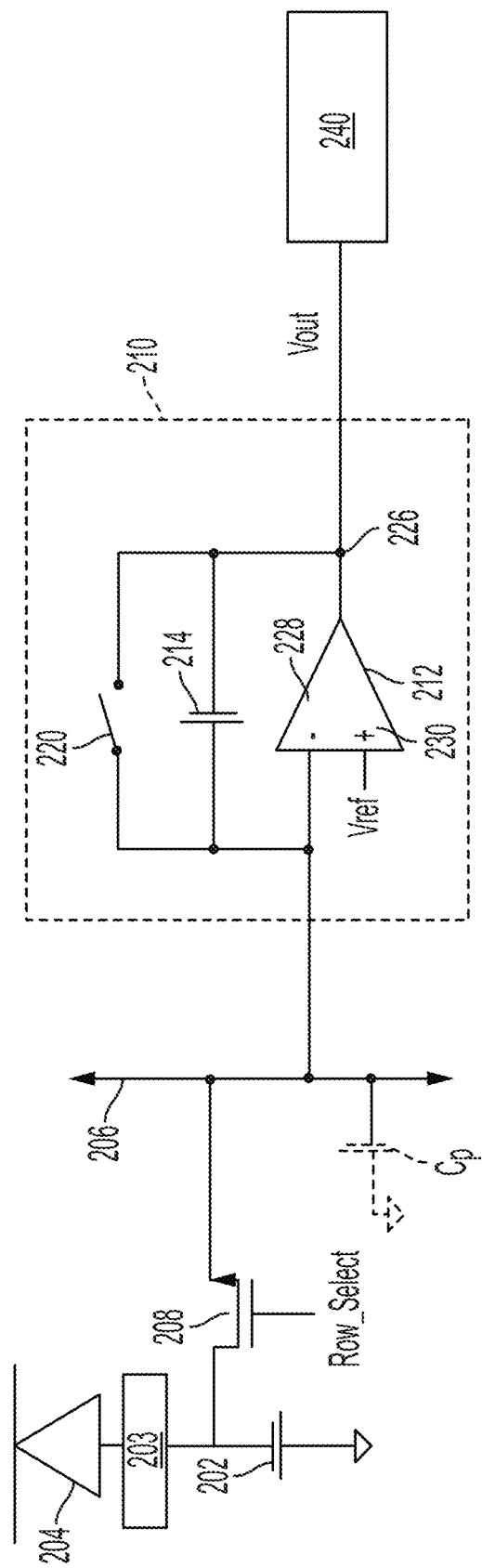
FIG. 2 is a schematic diagram of a prior art capacitance transimpedance amplifier readout circuit.

FIG. 2 shows an integration capacitor 202 connected to a CTIA 210 such as is known in the art. The integration capacitor 202 is arranged and configured so that it receives and stores a charge from a photo-detector such as a photodiode 204. There are different manners in which the connection between the integration capacitor 202 and the photo diode 204 can be made and, as such, the connection includes a general reference to a connection circuit 203.

For instance, the flow of current from the photodiode 204 into the integration capacitor is controlled by an injection transistor. The gate of the injection transistor is connected to a bias voltage. The level of this voltage can be selected by the skilled artisan and is used, in part, to keep the photodiode in reverse bias.

The terms "connection" and "connected" can include an indirect "connection" where elements are between two connected elements and a direct "connection" wherein no elements (other than the connector) are between the elements. When the terms the terms "connection" or "connected" are used in this specification it shall be understood that both an indirect and a direct connection are being recited. However, if the term "direct connection" is used, it shall be interpreted as just described.

Another way to control the flow of current is with an injection transistor where the bias voltage is controlled by an amplifier that provides negative feedback to the gate voltage of the injection transistor. Such a circuit is referred to as a buffered direct injection (BDI) circuit or cell. A BDI cell is commonly used to prevent de-biasing of the photodiode for high dynamic range scenes containing areas with high flux. That is, the amplifier can keep the reverse bias across the photodiode constant, independent of photocurrent. Either type of connection can be utilized in embodiments of a passive readout circuit disclosed herein. Herein, the DI and BDI circuits are generally shown as reference numeral 203 and referred to as bias control circuit.

Based on the above, the skill artisan will realize that the box 203 can be either of the above connection circuits.

The integration capacitor 202 is connected to a column line 206. The column line 206 can be connected to other, but not illustrated, integration capacitors. To read out a particular integration capacitor a row select transistor 208 is provided for each integration capacitor. Upon receipt of a particular row select signal, the row select transistor 208 allows the charge from the integration capacitor 202 to be dumped onto the column line 206. The charge is then amplified by the CTIA 210 to convert it to a voltage (Vow) that is provided to an analog-to-digital converter (ADC) 240.

The CTIA 210 includes an operational amplifier 212 having an inverting input 228 and a non-inverting input 230. The non-inverting input 230 can be connected to a reference voltage Vref. The CTIA 210 also includes a feedback capacitor 214 connected in a feedback path of the CTIA 210 between the output 226 of the amplifier 212 and the inverting input 228 of the amplifier 212, and a reset switch 220 connected between the inverting input 228 and the output 226 of the operational amplifier 212.

The inverting input 228 of the amplifier 212 is electrically connected to the integration capacitor 202 through column line 206 when the appropriate row select signal (Row_Select) is provided to the row select transistor 208.

Such a read out circuit can have one or more issues that led to the decline in their usage. In particular, a parasitic capacitance (shown as parasitic capacitor Cp) is developed on the column line when charge is moved from the integration capacitor 202 to the CTIA 210. In FIG. 2, the parasitic capacitor Cp is shown in dashed lines as it is an effect, not an actual capacitor.

The parasitic capacitance leads to noise in $V_{out}$. In particular, signal gain of the CTIA 210 is equal to Cint/Cfb where Cfb is the capacitance of the feedback capacitor 214 and Cint is the capacitance of the integration capacitor 202. However, amplifier noise gain is equal to Cint+Cp/Cfb. As can be seen, even small values of Cp can lead to large increases in noise in Vout.

In one embodiment, the CTIA feedback capacitor 214 is omitted and, instead, Cp is input to amplifier 212 such that it forms the feedback capacitor. In one embodiment this can be achieved by forming a "shield" along the passive column bus. Stated differently, embodiments herein convert Cp into Cfb and the result is low amplifier noise gain.

Figure 3:
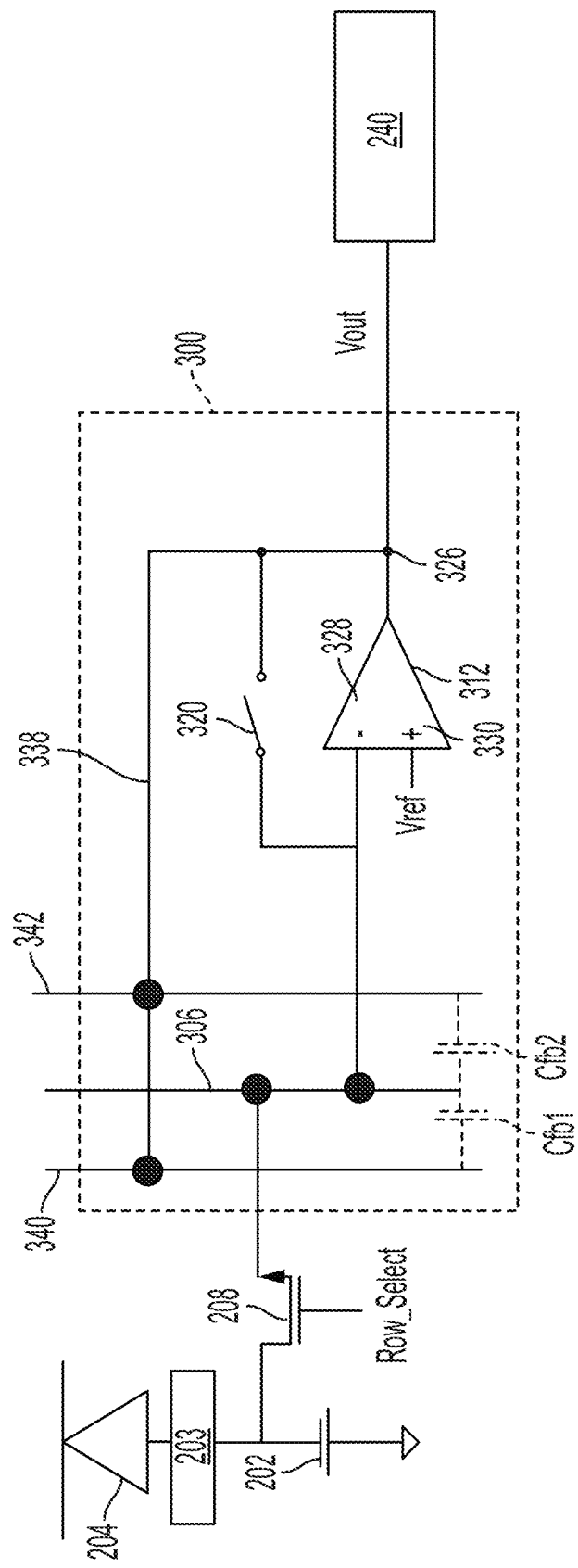
FIG. 3 is readout circuit according to one embodiment.

In FIG. 3 on example passive readout circuit 300 according to one embodiment. The passive readout circuit 300 is connected, as above, to an integration capacitor 202 connected to a photo-detector such as photodiode 204. Again, the flow of charge from the photodiode 204 to the integration capacitor 202 can pass through a DI or BDI circuit generally shown be reference numeral 203.

The integration capacitor 202 is connected to a column line 306. The column line 306 can be connected to other, but not illustrated, integration capacitors. As above, to read out a particular integration capacitor the row select transistor 208 is provided for each integration capacitor. Upon receipt of a particular row select signal, the row select transistor 208 allows the charge from the integration capacitor 202 to be dumped onto the column line 306. The charge is then amplified by the operational amplifier 312 to convert it to a voltage ($V_{out}$) that is provided to an analog-to-digital converter (ADC) 240.

In FIG. 3 the operational amplifier 312 of the passive readout circuit 300 can include an inverting input 328 and a non-inverting input 330. The non-inverting input 230 can be connected to a reference voltage Vref. The passive readout circuit 300, unlike the CTIA of FIG. 2, does not include a separate feedback capacitor 214. The passive readout circuit includes a reset switch 320 connected between the inverting input 228 and the output 326 of the operational amplifier 312.

The amplifier 312 is electrically connected to the integration capacitor 202 through column line 306 when the appropriate row select signal (Row_Select) is provided to the row select transistor 208. In a manner similar to the CTIA of FIG. 2, the amplifier 312 includes a "capacitance" connected between its output 326 and its inverting input 328. However, the capacitance is not a physical device but, rather is created when charge passes along the column line 306 to the amplifier 312 (e.g., when row select switch 208 is passing charge) due to parasitic capacitances between the column line 306 and one or more shield lines (340/342) formed near that line. Both shield lines 340/342 are connected to the output 328 of the amplifier 312 by feedback connection line 338.

The parasitic capacitances shown in FIG. 3 are labelled Cfb1 and Cfb2 to indicate that they form a feedback capacitance related to the amplifier 312. The total capacitance of the two parallel connected capacitances (Cfb1 and Cfb2) is Cfb1+Cfb2=Cfeedback. The gain of the amplifier 312 is, therefore, Cint/Cfeedback, where Cint is the capacitance of the integration capacitor 202. There is little to no noise amplification because the "noise" is now absorbed into Cfeedback.

Figure 4:
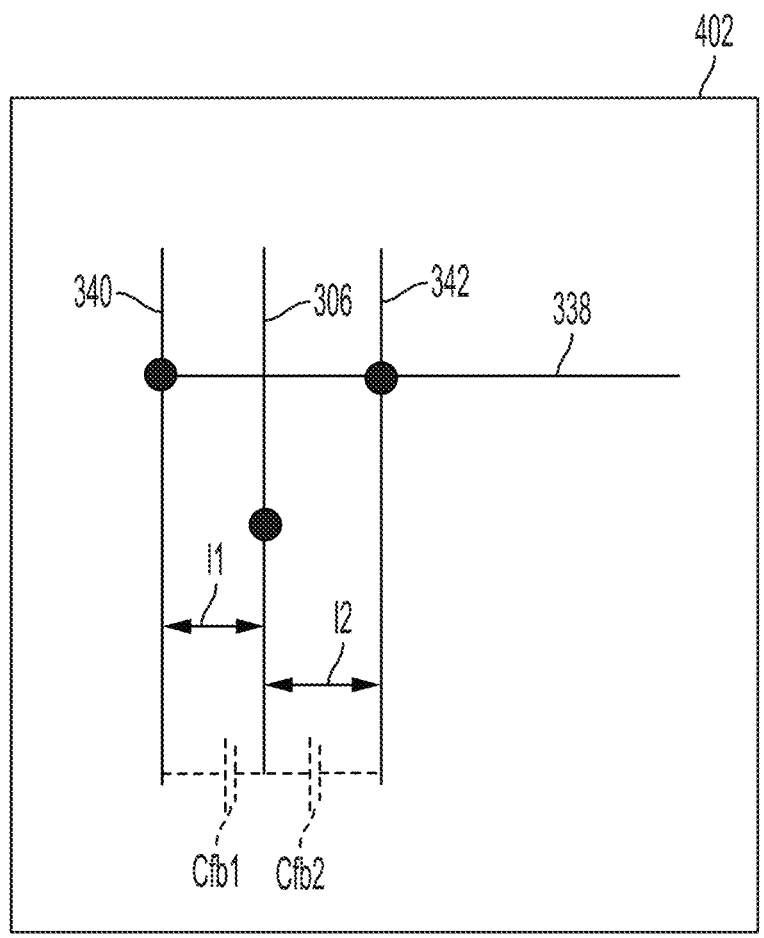
FIG. 4 shows spacing between the column line and the shield lines.

With reference now to FIG. 4, the column line 306 and its spacing from the first and second shield lines 340, 342 is illustrated. Also shown is a substrate 402. This substrate 402 is formed of an oxide containing material so that the first shield line 340 and the column line 306 together form a first metal-oxide-metal capacitor. Such a capacitor is also called a "finger capacitor." Similarly, the second shield line 342 and the column line 306 form a second metal-oxide-metal capacitor. The spacing l1 and l2 between the column line 306 and the first and second shield lines 340, 342, and the thickness of each line defines the respective parasitic capacitance Cfb1, Cfb2 created due to current/charge flow through the column line 306.

The passive readout circuit of FIG. 3 can be formed on the substrate 402 in one embodiment. Such a formation can be accomplished in a method that includes forming the column bus 306 on the substrate 402.

The method also includes forming the first shield line 340 on the substrate 402 near the column bus 306 such that a first parasitic capacitance (Cfb1) is created between the first shield line 340 and the column bus 306 when charge from the integration capacitor 202 is discharged onto the column bus 306, where the first parasitic capacitance Cfb1 is a function of the spacing between the column bus 306 and the first shield line 340 that together form a first metal-oxide-metal capacitor.

Similarly, the method includes forming a second shield line 342 on the substrate 402 near the column bus 306 such that a second parasitic capacitance (Cfb2) is created between the second shield line 342 and the column bus 306 when charge from the integration capacitor 202 is discharged onto to the column bus, where the second parasitic capacitance Cfb2 is a function of the spacing between the column bus 306 and the second shield line 342 that together form a second metal-oxide-metal capacitor.

The method also included connecting the column bus 306 to a first input of an amplifier 312 (inverting input 328) and connecting the first and second shield lines 340, 342 to the output 326 of the amplifier 312.

The method can also include one or more of: connecting a reference voltage (Vref) to a second input of the amplifier 312 (non-inverting input 330); connecting a reset switch 320 between the first input 328 and the output 326 of the amplifier 312; and connecting the row select switch 208 between the integration capacitor 202 and the column bus 306 to allow for selectively connecting the column bus 306 to the integration capacitor 202 during operation.

Of course, other connections could be made in the method based on the teaching herein to form a passive read out circuit or an image detector.

Forming a circuit as described above allows for the omission of the typical plate capacitor (such as CTIA feedback capacitor 214). Instead, metal-oxide-metal capacitors are formed. CMOS processing steps allow for easily forming such metal-oxide-metal capacitors as part of a normal process flow. In contrast, in the prior art, forming plate capacitors requires additional steps (or external processes). Thus, the devices and methods disclosed herein can have reduced processing as compared to the prior art.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A passive readout circuit for reading out a charge stored on an integration capacitor coupled to a photodiode, the passive readout circuit comprising:
    a column bus selectively connectable to the integration capacitor;
    at least one shield line arranged near the column bus such that a first parasitic capacitance is created between the at least one shield line and the column bus;
    an amplifier having a first input, a second input and an output;
    wherein the column bus is connected to the first input and the at least one shield line is connected to the output of the amplifier.

2. The circuit of claim 1, wherein the at least one shield line includes a first shield line and a second shield line and both the first and second shield lines are connected to the output of the amplifier.

3. The circuit of claim 2, wherein the column bus and the first shield line are arranged on a substrate formed of an oxide and define a first metal-oxide-metal capacitor.

4. The circuit of claim 3, wherein the column bus and the second shield line are arranged on the substrate and define a second metal-oxide-metal capacitor.

5. The circuit of claim 4, wherein the first and second metal-oxide-metal capacitors define a feedback capacitance coupled between the first input and the output.

6. The circuit of claim 1, wherein the second input is a non-inverting input and is connected to a reference voltage and the first input is an inverting input.

7. The circuit of claim 1, further including a reset switch connected between the first input and the output.

8. The circuit of claim 1, in combination with a row select switch connected between the integration capacitor and the column bus that selectively connects the column bus to the integration capacitor.

9. An image detector comprising:
    a photo-diode;
    an integration connected to the photo-diode; and
    a passive readout circuit comprising:
        a column bus selectively connectable to the integration capacitor;
        a first shield line arranged near the column bus such that a first parasitic capacitance is created between the first shield line and the column bus;
        a second shield line arranged near the column bus such that a second parasitic capacitance is created between the first shield line and the column bus;
        an amplifier having a first input, a second input and an output; and
        wherein the column bus is connected to the first input, and the first and second shield lines are both connected to the output of the amplifier.

10. The image detector of claim 9, further comprising:
    a bias control circuit connected between the photo-diode and the integration capacitor.

11. The image detector of claim 9, wherein the second input is a non-inverting input and is connected to a reference voltage and the first input is an inverting input.

12. The image detector of claim 11, further including a reset switch connected between the first input and the output.

13. The image detector of claim 11, further including a row select switch connected between the integration capacitor and the column bus that selectively connects the column bus to the integration capacitor.

14. A method of forming a passive readout circuit for reading out a charge stored on an integration capacitor coupled to a photo-diode, the method comprising:
    forming a column bus on a substrate;
    forming a first shield line on the substrate near the column bus such that a first parasitic capacitance is created between the first shield line and the column bus when charge from the integration capacitor is discharged onto the column bus;
    forming a second shield line on the substrate near the column bus such that a second parasitic capacitance is created between the second shield line and the column bus when charge from the integration capacitor is discharged onto the column bus;
    connecting the column bus to a first input of an amplifier, the amplifier including the first input, a second input and an output; and
    connecting the first and second shield lines to the output of the amplifier.

15. The method of claim 14, wherein the substrate is formed of an oxide and the column bus and the first shield line define a first metal-oxide-metal capacitor.

16. The method of claim 15, wherein the column bus and the second shield line define a second metal-oxide-metal capacitor.

17. The method of claim 15, wherein the second input is a non-inverting input, the first input is an inverting input and the method further includes:
    connecting a reference voltage to the second input.

18. The method of claim 17, further including connecting a reset switch between the first input and the output.

19. The method of claim 18, further including connecting a row select switch between the integration capacitor and the column bus that selectively connects the column bus to the integration capacitor.

\* \* \* \* \*